Sept. 17, 1957 J. A. ARMSTRONG 2,806,807

METHOD OF MAKING CONTACTS TO SEMICONDUCTOR BODIES

Filed Aug. 23, 1955

Inventor:
John A. Armstrong,
by Paul A. Frank
His Attorney.

2,806,807
Patented Sept. 17, 1957

2,806,807

METHOD OF MAKING CONTACTS TO SEMICONDUCTOR BODIES

John A. Armstrong, Schenectady, N. Y., assignor to General Electric Company, a corporation of New York Application August 23, 1955, Serial No. 530,030
10 Claims. (Cl. 148—1.5)

Figure 1:
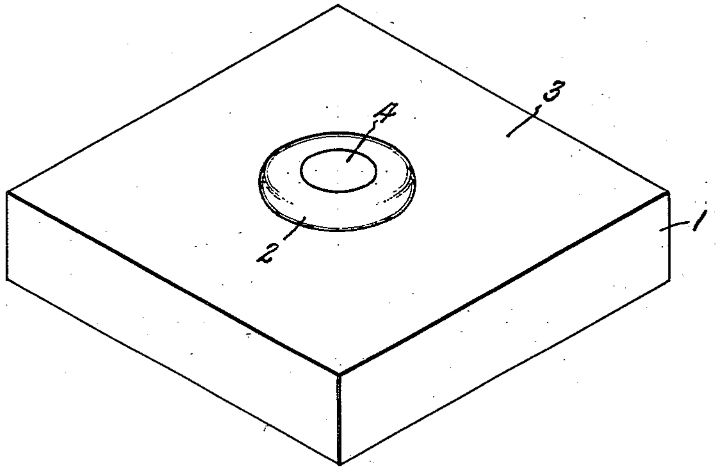

The present invention relates to crystalline semiconductive bodies, and more particularly to means for making electrical contacts thereto.

In fabricating asymmetrically conductive devices such as rectifiers and transistors from semiconductor bodies it is necessary to make electrical contact thereto. Contacts made to a semiconductive crystalline body such as silicon or germanium may be of two general types, rectifying and non-rectifying. The determinant of whether a particular contact is rectifying or non-rectifying lies in the electrical conductivity characteristics of the semiconductor body and the contact material.

Semiconductive materials such as silicon or germanium may be either P-type, possessing positive conductivity characteristics due to an excess of electron vacancies, or positive holes therein, or N-type, possessing N-type conductivity characteristics due to an excess of electrons therein. Whether a particular semiconductor body is P-type or N-type depends upon the type and quantity of electrically significant impurities contained therein. Certain impurities termed "donor activators" furnish an excess of electrons to the semiconductor crystal lattice causing the body to possess N-type conductivity characteristics, in which case electrical conduction occurs by a flow of electrons. Arsenic, antimony, and phosphorus, occurring in group V of the periodic table, are examples of donor activators. Certain other impurities, termed "acceptor activators" act to remove electrons from the semiconductor crystal lattice causing the body to possess P-type conductivity characteristics, in which case electrical conduction occurs by a flow of electron vacancies or "positive holes." Boron, aluminum, gallium and indium, located in group III of the periodic table, are examples of acceptor impurities. In referring to the conductivity characteristics of a semiconductor body in this specification, it is to be understood that there are two conductivity types of semiconductor, namely N-type and P-type. If one of these enumerated conductivity types is referred to as "one conductivity type," it is to be understood that the remaining conductivity type may be denominated as "opposite conductivity type."

When a "broad area" contact, as opposed to a point or line contact, is made to a particular crystalline semiconductor body, alloying occurs between the semiconductor body and the contact material at the area of contact.

If the contact material is either a donor or acceptor activator material which tends to induce conductivity characteristics into the semiconductor body opposite to the conductivity characteristics which it initially possesses, a region of the semiconductor body immediately adjacent the alloy region becomes impregnated with opposite conductivity inducing activator impurity atoms which convert that region of the semiconductor to the conductivity type opposite from the conductivity type of the main portion of the semiconductor body. The boundary between the conductivity-converted region and the remainder of the semiconductor body constitutes a P–N junction and the alloyed contact so formed is a rectifying contact.

If, on the other hand, the contact material is an activator material which tends to induce conductivity characteristics into the semiconductor body of the same type initially present therein, there is no conductivity-type conversion and the alloyed contact so formed is non-rectifying. Likewise, if the contact material is neither a donor nor an acceptor, and has no effect upon the conductivity characteristics of the semiconductor, no conductivity-type conversion occurs, and the contact so formed is non-rectifying.

In forming contacts to semiconductor bodies such as germanium and silicon, the semiconductor body must first be cleaned free of all oxide coating. The usual method of removing oxide coatings is by grinding, etching, or by both. While this step is reasonably satisfactory with germanium, it is less satisfactory with silicon. This is due to the great affinity of silicon for oxygen. A germanium semiconductor body may be ground or etched and allowed to remain in air for some time and the surface remains free of oxide coating. Silicon, on the other hand, is so reactive with oxygen that as soon as one layer of oxide is removed from a silicon body by etching or grinding, another layer forms on the surface before contacts can be applied. In fact, it is not clear that grinding and etching actually remove oxide coatings from silicon bodies. It is possible that grinding merely forces the oxide coating into the body of a silicon crystal. It is also possible when a silicon crystal is etched to remove an oxide coating, that as soon as the silicon face is exposed, it reacts with oxygen present in the etching solution to form a new layer of oxide. Whether the oxide coatings inevitably present on the surface of silicon crystals are never thoroughly removed by conventional methods, or are replaced by new oxide films as soon as they are removed, it is certain that conventional methods heretofore utilized to remove oxide coatings from silicon crystal bodies are not satisfactory.

In order to overcome the difficulties encountered in removing oxide coatings from crystalline silicon bodies preparatory to making contact thereto, either rectifying or non-rectifying, it has become the accepted practice in making contacts to silicon bodies to first clean the surface of the silicon body as well as possible, and then alloy the contact material to the silicon body at temperatures sufficiently high to cause the oxide coating present to be dissolved away by the contact material. Such processes are generally conducted at temperatures in excess of 600° C. While such processes form satisfactory contacts, the high temperatures necessary are extremely detrimental to the semiconductive properties of crystalline semiconductors. Thus, when a crystalline silicon body is heated to a temperature above 450° C. the "heat treatment" of the silicon body greatly decreases the lifetime of minority charge carriers within the silicon crystal body. Since long minority charge carrier lifetime is essential to the production of efficient asymmetrically conductive devices, particularly transistors, it is extremely difficult to produce efficient devices of this type when temperatures above 450° C. are utilized to make contacts to silicon semiconductor bodies. Another disadvantageous result of the use of high temperatures to make contact to silicon bodies is the change of resistivity of the silicon which inevitably accompanies heat treatment of the bodies at temperatures in excess of 450° C.

Accordingly, one object of the invention is to provide a method of making contacts to crystalline semiconductor bodies which simultaneously removes the oxide coating therefrom.

A further object of the invention is to provide a method of making contacts to crystalline semiconductor bodies which does not result in high temperature damage to the semiconductor bodies.

The novel features characteristic of the invention are set forth in the appended claims. The invention itself, together with further objects and advantages thereof, may best be understood by reference to the following description taken in conjunction with the drawing, in which Figs. 1 and 2 are illustrative of a semiconductor body, to which contacts are made, during successive stages of the practice of the invention.

Briefly stated, in the practice of the invention, I form electrical contacts to a crystalline body of a semiconductor body by forming a pool of acid etching solution upon the surface thereof, placing a quantity of contact material in the pool, and heating the semiconductor until the etching solution attacks both semiconductor and contact material. When the two etched surfaces come into contact at a temperature at which the contact material is molten, a clean, strong alloyed junction is formed between the semiconductor and the contact material.

Figure 2:
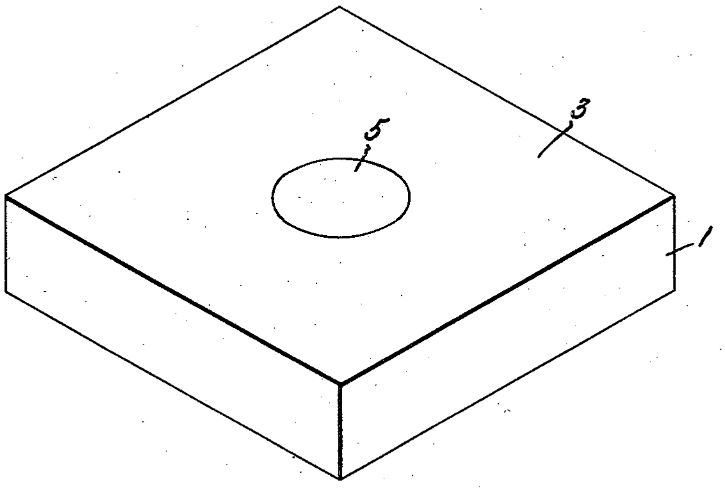

In Fig. 1 of the drawing there is shown diagrammatically a crystalline silicon body about to be treated according to the invention. In Fig. 1 a silicon ingot 1, preferably monocrystalline in structure, is shaped to the proper size, and the surface to be contacted is ground and etched according to conventional methods well known to the art. Silicon wafer 1 is then placed upon a level horizontal surface in an oven or other heating device (not shown) capable of raising its temperature to approximately 390° C. Such devices are well known to the art, and since they do not constitute a part of my invention, will not be described herein.

Next, a pool 2 of acid etching solution is deposited upon the upper, horizontal surface 3 of silicon ingot 1. The etching solution comprising pool 2 may be any of a number of etching solutions frequently used to etch semiconductor surfaces, the only requisites being that the etching solution be one which dissolves the oxide layer on the surface of a silicon body at temperatures of about 390° C. One suitable etching solution is "$CP_4$ etch" comprising approximately 40 parts by volume of reagent grade concentrated nitric acid (specific gravity 1.42), 25 parts by volume of reagent grade hydrofluoric acid (22° Baumé), 25 parts by volume of reagent grade glacial acetic acid (99.8% pure), and ½ part by volume of reagent grade bromine (99.8% pure). Another suitable etching solution which may be used in practicing the invention is denominated as "white etch" and comprises approximately 3 parts by volume of concentrated nitric acid to 1 part by volume of concentrated hydrofluoric acid (purities the same as hereinbefore specified). Alternatively, an etching solution consisting only of concentrated reagent grade hydrofluoric acid may be used. Although not essential, it is preferable that the etching solution used in the practice of the invention contain at least 10% by volume of reagent grade concentrated hydrofluoric acid, since this acid is well known to attack silicon dioxide, the oxide protecting silicon bodies. While certain suitable etching solutions have been set forth by way of example it will be appreciated that many other etching solutions which attack silicon dioxide may be used in the practice of the invention. Pool 2 is held in place by surface tension although, if desirable, silicon body 2 may be slightly excavated, or other suitable means may be supplied to retain pool 2 in place.

After pool 2 has been deposited upon the surface 3 of silicon crystalline body 1, a small quantity of contact material 4 is placed within pool 2. The form of contact material 4 used may be varied. Thus, for example, contact material 4 may be in small pieces, or in flake form; however, it is preferably applied in thin leaf form, for example in small leaves approximately 2 millimeters squared and 0.003 inch thick. The quantity of contact material may vary greatly, the only controlling factor being the size and thickness of the contact desired.

The composition of contact material 4 may vary, depending upon the conductivity type of the silicon crystal body to which contact is being made, and the type of contact desired. If silicon body 1 possesses N-type conductivity characteristics and it is desired to form a non-rectifying contact therewith, contact material 4 may be any material which does not induce electrical conductivity changes into N-type silicon, and which has a melting point below 390° C., as for example pure tin. It is, however, preferable that to form such contacts to N-type silicon, contact material 4 be a donor activator for silicon which has the additional property of melting at a temperature below 390° C. Such materials may be alloys of indium with ½ to 2% by weight of the donor activators, for example, arsenic, phosphorus or antimony. The use of these alloys as donor contacts for semiconductors is described and claimed in patent application Serial No. 410,609 of John S. Saby, filed February 16, 1954, and assigned to the same assignee as the present invention. The electrical properties of these alloys are governed by the donor constituents due to their much higher diffusion coefficients. On the other hand, since the alloys are predominantly indium, their physical properties are governed primarily by indium and they melt at temperatures sufficiently low (below 390° C.) as to be useful in practicing the invention.

If, on the other hand, the silicon body to which contact is to be made is N-type and it is desired to make a rectifying contact thereto, the chosen contact material should be an acceptor activator for silicon, that is, a material which induces P-type electrical conductivity characteristics into a silicon body, and melts at a temperature below 390° C. Some such materials which may be utilized in this respect are pure indium and alloys of indium with other acceptor activators such as boron, aluminum or gallium. These alloys should be in such proportions that the melting point thereof be below 390° C. This condition will generally result when indium is present in the alloy in proportions of 98% by weight or greater.

If the silicon bodies to which contacts are to be made possess P-type conductivity characteristics and it is desired to make non-rectifying contact therewith, contact material 4 may be any material which does not induce conductivity changes into P-type silicon and melts below 390° C., as for instance pure tin. It is preferable, however, in forming non-rectifying contacts to P-type silicon that contact material 4 be an acceptor activator material for silicon which melts at a temperature below 390° C. These may be any of the materials used to form rectifying contacts to N-type silicon bodies, for example pure indium, and alloys of indium with 2% or less of other acceptor activators for silicon such as aluminum, gallium or boron.

If, on the other hand, the silicon bodies to which contact is to be made possess P-type conductivity characteristics and it is desired to make a rectifying contact therewith, contact material 4 should be a donor activator for silicon which melts at a temperature below 390° C. Such materials are the same materials which are preferably used to make non-rectifying contact with N-type silicon bodies as is set forth hereinbefore. Such materials may be alloys of indium with ½ to 2% by weight of the donor activators for silicon, namely antimony, arsenic or phosphorus.

Once contact material 4 has been chosen, as set forth hereinbefore, to cause the desired type of contact to be formed, the material is deposited in pool 2 of etching solution, and the silicon body is heated to a temperature at which the etching solution in pool 2 may be seen to boil vigorously, attacking both the surface 3 of silicon body 1 and contact material 4. While this temperature may be varied some, it is preferably controlled to a temperature from 390° C. to 450° C. At temperatures below 390° C. the etching solution does not readily attack the oxide coating covering the surface 3 of silicon body 1. At temperatures in excess of 450° C. the silicon heat-treats with resultant reduction of minority charge carrier lifetime and change of resistivity, as hereinbefore noted.

Since it is one object of the invention to remove the inevitably present oxide coating from silicon bodies, it is desirable that the process be carried out in an atmosphere non-conducive to the formation of silicon dioxide. This is accomplished by carrying out the process in a reducing atmosphere. Such an atmosphere is preferably supplied by dry hydrogen but may also be supplied by dry carbon-monoxide or certain hydrocarbon gases such as methane. The reducing gas chosen is continually flushed through the chamber in which the heating takes place.

When the silicon body has been heated to from 390° C. to 450° C. the etching solution is observed to boil vigorously and disappear, leaving a dark scale in its place. The body is maintained at elevated temperature until all liquid has disappeared, approximately 10 minutes ordinarily being sufficient. Although no deleterious effects have been observed from longer heating periods, times in excess of ten minutes at elevated temperatures do not appear to add to the desirable characteristics of the contacts formed. In maintaining the silicon body at elevated temperature, once the reaction has commenced, it is only necessary that all moisture be removed from the contact area. This condition is indicated when the black scale produced by the reaction cracks and begins to flake, exposing the silicon body. This generally occurs at a time of approximately 10 minutes. The heating operation is then discontinued, and the silicon body is removed from the heating device, and allowed to cool to room temperature. The remainder of the black flaky scale covering the contact area is removed, as by scraping with a sharp object.

The condition of the silicon body at this time is represented by Fig. 2 of the drawing in which a metallic contact 5 is seen to be alloyed to the surface 3 of silicon body 1. This contact is formed at the site originally occupied by pool 2 of etching solution and covers that portion of surface 3 originally covered by pool 2. Electrical contact may be made to contact 5 by soldering a terminal wire of any suitable metal thereto at low temperature using any conventional low temperature solder, as for example, a lead-tin solder.

The following are specific examples illustrative of the invention.

*Example I*

A non-rectifying contact is formed upon the surface of a P-type silicon monocrystalline ingot ½ inch long, ¼ inch wide and 1/16 inch thick consisting essentially of pure silicon having approximately 5 x $10^{15}$ atoms of boron per cubic centimeter thereof, by first etching with "$CP_4$ etch," rinsing with methyl alcohol and laying horizontally flat within an oven. 0.1 cubic centimeter of "$CP_4$ etch" is placed upon the surface of the silicon ingot. A piece of indium 2 millimeters squared and 0.003 inch thick is placed upon the drop of etching solution and the ingot is heated to 400° C. and maintained at that temperature for 10 minutes. The oven is continually flushed with dry hydrogen at 1 atmosphere pressure. When the heating period has elapsed, the silicon ingot is removed and allowed to cool. When cool, scale is scraped from the surface and a non-rectifying contact is found to be formed upon the surface of the silicon ingot covering that portion of the surface originally covered by the drop of etch.

*Example II*

A rectifying contact is formed upon the surface of a monocrystalline ingot of P-type silicon by using the same size and purity ingot as set forth in Example I, using a piece of contact material the same size as used in Example I but consisting of indium and 2% by weight of antimony. The procedure as set forth in Example I is followed resulting in a rectifying contact being formed upon the surface of the silicon ingot.

*Example III*

A non-rectifying contact is formed upon the surface of an N-type monocrystalline silicon ingot consisting essentially of pure silicon having approximately $10^{16}$ atoms of phosphorus per cubic centimeter thereof by substituting such an ingot, of the same size, for the nigot of Example I, and using a piece of contact material the same size as that used in Example I but consisting of an alloy of indium and 2% of antimony by weight. The procedure as set forth in Example I is followed, resulting in a non-rectifying contact being formed upon the surface of the silicon ingot.

*Example IV*

A rectifying contact is formed upon the surface of a monocrystalline ingot of N-type silicon by substituting such an ingot, of the same size and purity, for the ingot of Example I, and using the same size and composition contact material as set forth in Example I. The procedure as set forth in Example I is followed, resulting in a rectifying contact being formed upon the surface of the silicon ingot.

Although the method of forming contacts according to the invention has its greatest utility when practiced upon silicon bodies, with respect to which it has been described, it will be appreciated that the invention may be practiced with other semiconductors, as for instance, germanium.

The method of the invention for making contacts to semiconductors may be utilized in the formation of a number of useful devices. Thus, for example, a thin wafer of monocrystalline semiconductor may be contacted at one major surface with a rectifying contact and at the other major surface with a non-rectifying contact to form a semiconductor diode. Alternatively, such a body may be contacted with opposed rectifying contacts and a non-rectifying contact made to one lateral edge, resulting in a P–N junction transistor. Both of such type devices and others which may be produced according to the invention are disclosed and claimed in the co-pending application of R. N. Hall, Serial No. 187,478, filed September 29, 1950, now abandoned, and assigned to the same assignee as the present invention.

While the invention has been described with respect to certain specific embodiments, it will be appreciated that many modifications may be made without departing from the spirit of the invention. I intend, therefore, by the appended claims, to cover all such modifications as fall within the true spirit and scope of the invention.

What I claim as new and desire to secure by Letters Patent of the United States is:

1. The method of making an electrical contact to the surface of a monocrystalline semiconductor body, which method comprises depositing a pool of an acid etching solution upon the surface, placing within the pool a quantity of contact material having a melting point lower than 390° C., heating the body to a temperature above the melting point of the contact material and below 450° C. until the acid etching solution attacks the surface of the semiconductor body to remove all oxide coating therefrom, and maintaining the elevated temperature until the etching solution disappears, leaving the contact material alloyed to the surface of the semiconductor body.

2. The method of making an electrical contact to the surface of a crystalline semiconductor body, which method comprises depositing a pool of an etching solution containing at least 10% by volume of hydrofluoric acid upon the surface, placing in the pool a contact material having a melting point below 390° C., heating said body to an elevated temperature above the melting point of the contact material and below 450° C. in a reducing atmosphere until the etching solution attacks the surface of the semiconductor body to remove all oxide coating therefrom and maintaining the body at elevated temperature until the etching solution disappears, leaving the contact material alloyed to the surface of the semiconductor body.

3. The method of making an electrical contact to the surface of a crystalline silicon body, which method comprises depositing a pool of an etching solution containing at least 10% by volume of hydrofluoric acid upon the surface, placing in the pool a contact material having a melting point below 390° C., heating the body to an elevated temperature above the melting point of the contact material and below 450° C. in a reducing atmosphere until the etching solution attacks the surface of the silicon body to remove all oxide coating therefrom, and maintaining the body at the elevated temperature until the etching solution disappears, leaving the contact material alloyed to the surface of the silicon body.

4. The method of making an electrical contact to the surface of a crystalline silicon body, which method comprises depositing a pool of an acid etching solution upon the surface, placing in the pool a contact material having a melting point below 390° C., heating the body to a temperature of 390° to 400° C. in a gaseous atmosphere selected from the group consisting of dry hydrogen, dry carbon monoxide and methane until the etching solution attacks the surface of the silicon body to remove all oxide coating therefrom, and maintaining the body at the elevated temperature for a period not exceeding 10 minutes during which said etching solution disappears, leaving the contact material alloyed to the surface of the silicon body.

5. The method of making a rectifying contact to a surface of a crystalline silicon body of one conductivity type, which method comprises depositing a pool of an acid etching solution upon the surface, placing in the pool a contact material having a melting point lower than 390° C. and comprising an activator material for inducing opposite conductivity type conduction characteristics into the body, heating the body to a temperature between 390° C. and 450° C. until the acid etching solution attacks the surface of the silicon body to remove all oxide coating therefrom, and maintaining the body at the elevated temperature until the etching solution disappears, leaving the contact material alloyed to the surface of the silicon body.

6. The method of making a non-rectifying contact to a surface of a crystalline silicon body of one conductivity type, which method comprises depositing a pool of an acid etching solution upon the surface, placing in said pool a contact material having a melting point lower than 390° C. and comprising an activator material for inducing one conductivity type conduction characteristics into said body, heating the body to a temperature between 390° C. and 450° C. until the acid etching solution attacks the surface of the silicon body to remove all oxide coating therefrom, and maintaining the body at the elevated temperature until the etching solution disappears, leaving the contact material alloyed to the surface of the silicon body.

7. The method of making a rectifying contact to the surface of a crystalline N-type silicon body, which method comprises depositing a pool of an acid etching solution upon the surface, placing in the pool a contact material comprising indium and 0 to 2% by weight of a material selected from the group consisting of boron, aluminum and gallium, heating the body to a temperature between 390° C. and 450° C. until the acid etching solution attacks the surface of the silicon body to remove all oxide coating therefrom, and maintaining the body at an elevated temperature until the etching solution disappears, leaving the contact material alloyed to the surface of the silicon body.

8. The method of making a rectifying contact to the surface of a crystalline P-type silicon body, which method comprises depositing a pool of an acid etching solution upon the surface, placing in said pool a contact material comprising indium and ½ to 2% by weight of a material selected from the group consisting of arsenic, antimony and phosphorus, heating said body to a temperature between 390° C. and 450° C. until the acid etching solution attacks the surface of the silicon body to remove all oxide coating therefrom, and maintaining the body at an elevated temperature until the etching solution disappears, leaving the contact material alloyed to the surface of the silicon body.

9. The method of making a non-rectifying contact to the surface of a crystalline N-type silicon body, which method comprises depositing a pool of an acid etching solution upon the surface, placing in said pool a contact material comprising indium and ½ to 2% by weight of a material selected from the group consisting of arsenic, antimony and phosphorus, heating the body to a temperature between 390° C. and 450° C. until the acid etching solution attacks the surface of the silicon body to remove all oxide coating therefrom, and maintaining the body at an elevated temperature until the etching solution disappears, leaving the contact material alloyed to the surface of the silicon body.

10. The method of making a non-rectifying contact to the surface of a crystalline P-type silicon body, which method comprises depositing a pool of an acid etching solution upon the surface, placing in the pool a contact material comprising indium and 0 to 2% by weight of a material selected from the group consisting of boron, aluminum, and gallium, heating the body to a temperature between 390° C. and 450° C. until the acid etching solution attacks the surface of the silicon body to remove all oxide coating therefrom, and maintaining the body at an elevated temperature until the etching solution disappears, leaving the contact material alloyed to the surface of the silicon body.

References Cited in the file of this patent

UNITED STATES PATENTS

| | | |
|---|---|---|
| 1,263,656 | Fahrenwald | Apr. 23, 1918 |
| 2,731,704 | Spanos | Jan. 24, 1956 |